United States Patent
Oyama

(10) Patent No.: US 6,667,639 B2
(45) Date of Patent: Dec. 23, 2003

(54) FREQUENCY MULTIPLYING SYSTEM HAVING A PLURALITY OF OUTPUT FREQUENCIES

(75) Inventor: Yukihiro Oyama, Kawasaki (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/270,682

(22) Filed: Oct. 16, 2002

(65) Prior Publication Data

US 2003/0071665 A1 Apr. 17, 2003

(30) Foreign Application Priority Data

Oct. 16, 2001 (JP) ........................................ 2001-318465

(51) Int. Cl.[7] .............................................. H03K 5/159
(52) U.S. Cl. ........................................ 327/116; 327/158
(58) Field of Search ............................... 327/105, 116, 327/158, 261, 149, 114, 115

(56) References Cited

U.S. PATENT DOCUMENTS 5,786,715 A * 7/1998 Halepete .................... 327/116
5,955,902 A * 9/1999 Takada et al. ............... 327/116
6,005,420 A * 12/1999 Yoshizawa et al. .......... 327/116

* cited by examiner

Primary Examiner—Dinh T. Le
(74) Attorney, Agent, or Firm—Dickstein, Shapiro, Morin & Oshinsky, LLP

(57) ABSTRACT

A frequency multiplying system includes a frequency multiplier for multiplying a reference frequency to generate an internal clock, a delay circuit for introducing a variable delay to the internal clock, a plurality of clock generators each for generating first clocks in number corresponding to the number of frequency multiplication. The first clocks have the reference frequency and consecutive phase shifts from the phase of the reference-frequency clock. One of the first clocks having a rising edge leading from and nearest to the rising edge of the reference clock is selected and fed back to a phase comparator for controlling the variable delay of the delay circuit.

9 Claims, 14 Drawing Sheets

FREQUENCY MULTIPLYING SYSTEM HAVING A PLURALITY OF OUTPUT FREQUENCIES

BACKGROUND OF THE INVENTION (a) Field of the Invention

The present invention relates to a frequency multiplying system having a plurality of output frequencies and, more particularly, to a frequency multiplying system for generating a plurality of multiple-frequency signals based on an input reference-frequency signal.

(b) Description of the Related Art

A frequency multiplying system having a plurality of output frequencies is used in the field of computer systems for generating one or more multiple-frequency clocks having a frequency equal to or multiplied from a reference frequency of an input reference clock, the multiple frequency being generally $2^n$ times as high as the reference frequency, where given n is an integer including zero. Such a frequency multiplying system, which may be called herein multiple-frequency clock generator, is generally implemented by a phase locked loop (PLL) circuit.

FIG. 12 shows the configuration of a conventional multiple-frequency clock generator or PLL circuit. The conventional PLL circuit 200 includes a frequency multiplier 201, a delay circuit 202, a phase comparator 203, and three frequency dividers 204, 205 and 206. The frequency multiplier 201 multiplies the reference frequency of an input reference clock CLK10 to generate an internal clock CLK20, which is fed through the delay circuit 202 to each of the frequency dividers 204, 205 and 206 while being introduced with a delay time.

Each frequency divider 204, 205 or 206 divides the delayed internal clock to generate a multiple-frequency clock having a specified multiple frequency. In this example, the frequency divider 204 generates a quadruple-frequency clock CLK14, the frequency divider 205 generates a double-frequency clock CLK12, and the frequency divider 206 generates an equal-frequency clock CLK11, wherein all these clocks having frequencies defined in terms of the reference frequency are output from the PLL circuit 200.

One of the output clocks CLK14, CLK12, CLK11 from the frequency dividers 204, 205 and 206 which has a period equal to or longer than the period of the reference frequency, namely the output clock CLK11 in this example, is fed-back as a feedback clock to the phase comparator 203 to form a feedback loop. The phase comparator 203 compares the phase of the feedback clock CLK11 against the phase of the reference clock CLK10 by using the rising edge of the reference clock CLK10, thereby determining the delay time to be effected by the delay circuit 202. The delay circuit 202 has a plurality of delay elements each for introducing a unit delay time, and determines a desired delay time by selecting a number of the delay elements. By introducing a suitable delay time to the multiple-frequency internal clock CLK20 in the delay circuit 202, the PLL circuit 200 is locked with the reference clock CLK10, wherein the multiple-frequency clocks CLK11, CLK12 and CLK13 are all in synchrony with the reference clock CLK10.

FIGS. 13A and 13B are timing charts (or waveform diagrams) showing the timing relationships between the reference clock CLK10 and the multiple-frequency clocks CLK11, CLK12 and CLK14, at the timing of the phase comparison (in FIG. 13A) and at the timing after the locking (in FIG. 13B). At the start for the locking operation, as shown in FIG. 13A, the feedback clock CLK15 lags by a time length t12 with respect to the reference clock CLK10 in terms of the rising edges of the reference clock CLK10 and the feedback clock CLK15. The phase comparator 203 controls the delay circuit 202 to introduce a desired delay time to the internal clock CLK20 so that the rising edge of the feedback clock CLK15 approaches the rising edge of the reference clock CLK10.

By iterating the phase comparison of both the rising edges and the delay control of the delay circuit 202 so as to introduce a suitable delay time to the internal clock CLK20, the phase comparator 203 allows the PLL circuit 200 to be locked with the reference clock CLK 10, after the delay time introduced by the delay circuit 202 equals a time length t22 to obtain a synchrony of both the rising edges. After the locking, the phases of the multiple-frequency clocks CLK11, CLK12 and CLK14 which are obtained by diving the internal clock CLK20 are in synchrony with the phase of reference clock CLK10, as shown in FIG. 13B.

It is to be noted that the achievement of locking by the PLL circuit 200 means that the phase difference between the reference clock CLK10 and the internal clock CLK20 resides within an allowable error range. More specifically, a more detailed comparison while enlarging the time axis would find a small phase difference corresponding to the error between both the clocks CLK10 and CLK20. In addition, there is also a small phase difference between each two of the multiple-frequency clocks CLK11, CLK 12 and CLK14 obtained by dividing the delayed internal clock. These small phase differences may cause a problem especially in the quadruple-frequency clock CLK14, although the small phase difference causes a substantially little problem in the equal-frequency clock CLK11, in view of the short period of the quadruple-frequency clock CLK14. In this respect, there is a possibility that the phase difference between the reference clock CLK10 and the quadruple-frequency clock CLK14 may be a sum of the maximum phase error between the reference clock CLK10 and the feedback clock CLK15 and the maximum phase error between the feedback clock CLK15 and the quadruple-frequency clock CLK14.

In the PLL circuit 200 of FIG. 12, the delay control range in the delay circuit 202 should correspond to the single period of the reference clock CLK10, and thus the delay circuit 202 includes a plurality of delay elements for introducing a delay of the delay control range corresponding to the single period of the reference clock CLK10. If the number of the delay elements in the delay circuit 202 is large, however, the delay circuit 202 has a corresponding large occupied area. In addition, if the reference clock CLK10 has a large period which corresponds to a plurality of unit delay times, a larger number of the delay elements further increase the occupied area of the delay circuit 202. Furthermore, a larger delay control range means that a larger locking time is needed in the PLL circuit 200.

If another of the multiple-frequency clocks CLK12 and CLK14 having a smaller period than the output clock CLK11 is employed as the feedback clock 15, the phase error may include only the phase difference between the another of the multiple-frequency clocks CLK 12 and CLK14 and the reference clock CLK10. FIGS. 14A and 14B show the timing charts, similarly to FIGS. 13A and 13B, respectively, in the case wherein the quadruple-frequency clock CLK14 is employed as the feedback clock CLK15.

It is assumed that the feedback clock CLK15 has a delay time t13 with respect to the reference clock CLK10, as shown in FIG. 14A, at the timing of the phase comparison, i.e., the start of the locking operation. After the phase comparison, a delay time is introduced to the feedback clock CLK15 so that the rising edge of the feedback clock CLK15 leading from and nearest to the rising edge of the reference clock CLK10 coincides with the rising edge of the reference clock CLK10. After a delay time corresponding to the time length t33 is introduced to the feedback clock CLK15, the PLL circuit 100 is locked with the reference clock CLK10. In this case, the delay control range corresponds to the period of the quadruple-frequency clock CLK14.

After the locking of the feedback clock CLK15 with the reference clock CLK10, however, the phase of the equal-frequency clock CLK11 deviates from the phase of the reference clock CLK10 by a half period in terms of the reference clock CLK10 although the multiple-frequency clocks CLK12 and CLK14 are in synchrony the reference clock CLK10, as shown in FIG. 14B.

More specifically, since the quadruple-frequency clock CLK14 having a shorter period than the reference clock CLK10 is employed as the feedback clock, there are four rising edges in the feedback clock corresponding to a single rising edge of the reference clock CLK10, any of the four rising edges of the feedback clock may coincide with the rising edge of the reference clock CLK10 after the locking to thereby cause a pseudo locking. That is, if a feedback clock has a shorter period than the reference clock CLK10, it is not assured that the phase of the other multiple-frequency clocks each having a longer period than the feedback clock coincides with the phase of the reference clock CLK10.

A technique is known which assures a safe locking for all the multiple-frequency clocks even if a feedback clock has a shorter period than the reference clock CLK10. In this technique, the first one of the clock pulses of the internal clock CLK20 in a single period of the reference clock CLK10 is delivered during the locking operation, without delivering the remaining clock pulses. FIGS. 15A and 15B show, similarly to FIGS. 13A and 13B, respectively, the timing charts of this technique. The situation is such that the PLL circuit 200 achieves a locking when a delay time t24 is introduced to the feedback clock CLK15, as understood from FIG. 15A. After the locking, all the clock pulses of the internal clock CLK20 in a single period of the reference clock CLK10 is delivered to generate the multiple-frequency clocks CLK14, CLK12 and CLK11, as shown in FIG. 15B.

In the technique shown in FIGS. 15A and 15B, all the multiple-frequency clocks CLK11, CLK12 and CLK14 can be synchronized with the reference clock CLK10, with a phase error including only the locking error between the feedback clock CLK15 and the reference clock CLK10. However, the delay circuit 202 must have delay elements in number corresponding to the single period of the reference clock CLK10. This increases the occupied area of the delay circuit 202 as mentioned before.

SUMMARY OF THE INVENTION

It is therefore an object of the present invention to provide a frequency multiplying system having a plurality of output frequencies, capable of synchronizing all the multiple-frequency clocks with the reference clock, having a delay step equal to one of the output clocks having a period shorter than the period of the reference clock, and achieving the locking with a smaller phase error.

The present invention provides a frequency multiplying system comprising: a frequency multiplier for multiplying a reference frequency of a reference clock by a specified number to generate an internal clock; a delay circuit for introducing a first variable delay to said internal clock to output a delayed internal clock; at least one clock generator for generating first clocks based on said delayed internal clock, said first clocks having a multiple of said reference frequency and consecutive phase shifts by an equal amount from a phase of said reference clock, said at least one clock generator selecting one of said first clocks having a phase leading from and nearest the phase of the reference clock, an output from one of said at least one clock generator being fed back as a feedback clock; and a first phase comparator for comparing a phase of said feedback clock against the phase of said reference clock, said first phase comparator controlling said first variable delay based on a result of comparison by said first phase comparator to achieve a locking.

In accordance with the frequency multiplying system of the present invention, a plurality of first clocks are generated having consecutive phase shifts from the phase of the reference clock, and one of the first clocks having a phase leading from and nearest to the reference clock is selected as the feedback clock for comparison in the phase comparator to achieve a locking. This allows a smaller delay control range compared to the conventional frequency multiplying system to reduce the locking time in the frequency multiplying system, without involving therein a pseudo locking.

It is to be noted that the term "clock" as used herein means a signal including a pulse train having a repetitive frequency, and that although the "clock" is typically used as a clock signal in a computer system etc., the "clock" in the present invention may be used other than as a clock signal so long as it includes a pulse train having a repetitive frequency.

PREFERRED EMBODIMENTS OF THE INVENTION

Figure 1:
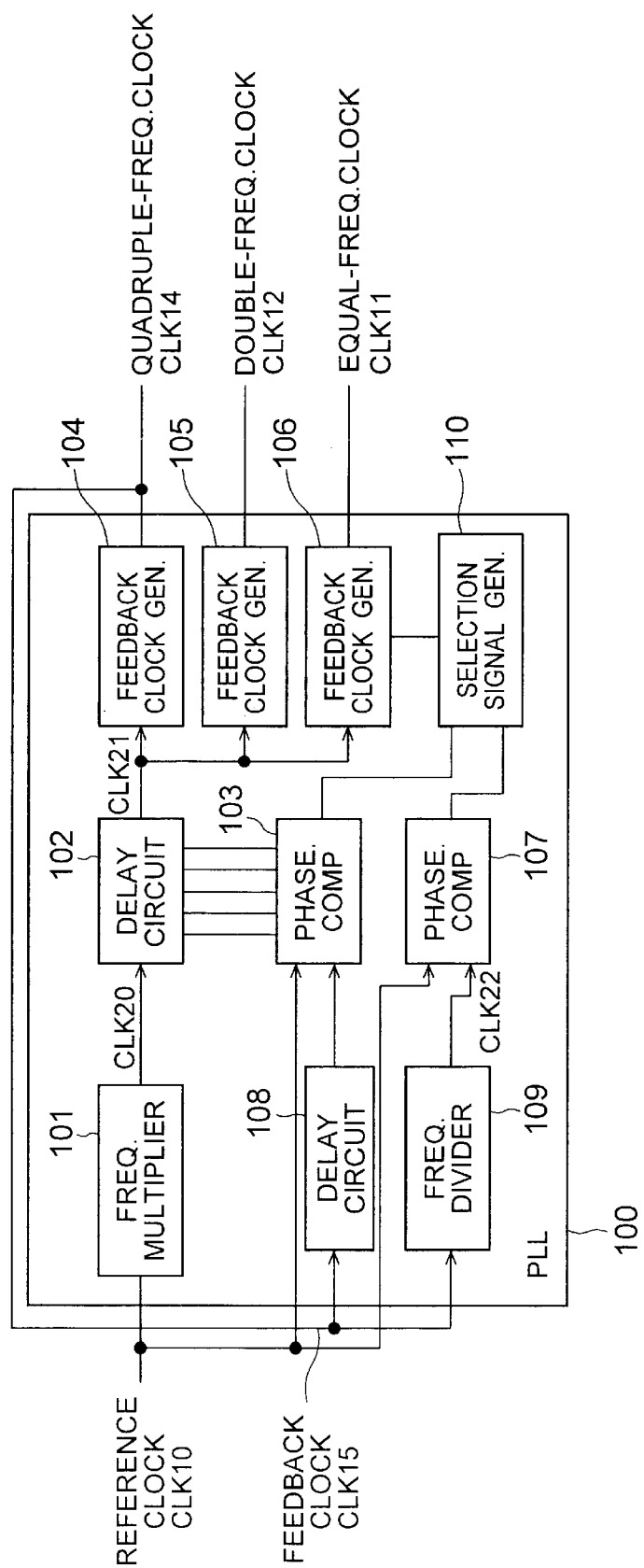
FIG. 1 is a block diagram of a PLL circuit shown as a frequency multiplying system according to a first embodiment of the present invention.

Now, the present invention is more specifically described with reference to accompanying drawings, wherein similar constituent elements are designated by similar reference numerals.

Referring to FIG. 1, a frequency multiplying system, generally designated by numeral 100, according to a first embodiment of the present invention is implemented as a PLL circuit, and includes a frequency multiplier 101, a delay circuit 102 having a variable delay, phase comparators 103 and 107, feedback clock generators 104, 105 and 106, another delay circuit 108, a frequency divider 109 and a selection signal generator 110. In short, the frequency multiplying system of the present embodiment uses different clocks as the feedback clock before and after the locking for achieving a short delay control range as well as an accurate synchrony, as detailed hereinafter.

The frequency multiplier 101 multiplies the reference frequency of the reference clock CLK10 to generate an quadruple-frequency internal clock CLK20, which is fed to the delay circuit 102. The phase comparator 103 receives the reference clock CLK10 and a feedback clock CLK15, and compares both the clocks CLK10 and CLK15 against each other to determine the delay time to be introduced to the internal clock CLK20 by the delay circuit 102. The delay circuit 102 introduces a delay to the quadruple-frequency internal clock CLK20 based on the output from the phase comparator 103. The output clock CLK21 from the delay circuit 102 is fed to the feedback clock generators 104, 105 and 106, and the feedback clock generator 104 delivers a quadruple-frequency clock CLK14, which is fed back as a feedback clock CLK15 to the phase comparator 103 through the delay circuit 108.

The phase comparator 103 detects at the rising edge of the reference clock CLK10 whether the object clock output from the delay circuit 108 assumes a high level, a low level, a rising edge or a falling edge, thereby effecting a phase comparison. By iterating the phase comparison by the phase comparator 103 and subsequent introduction of the delay time to the internal clock CLK20 by the delay circuit 102, the edge of the feedback clock CLK15 becomes in synchrony with the edge of the reference clock CLK10, whereby the PLL circuit 100 is locked with the reference clock CLK10. The feedback clock CLK15 used before the locking is generated by the procedure as described hereinafter, whereas the quadruple-frequency clock CLK14 is used as the feedback clock CLK15 after the locking.

Figure 2:
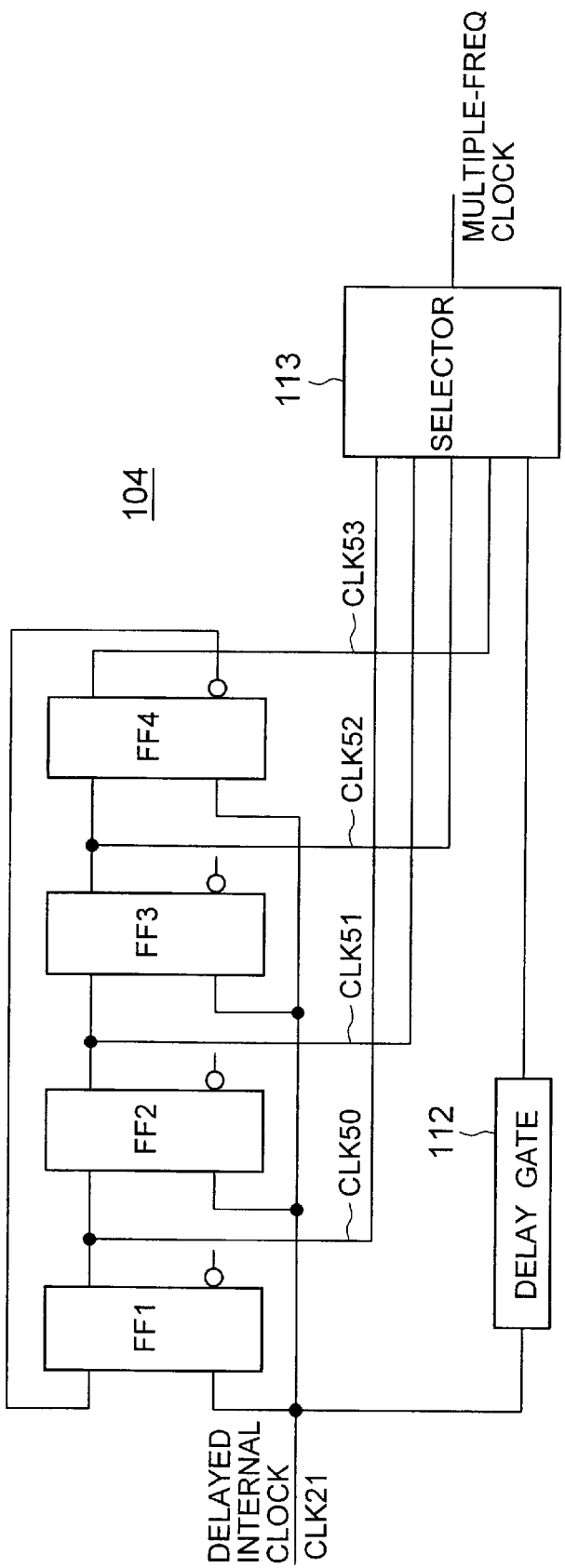
FIG. 2 is a block diagram of the feedback clock generator shown in FIG. 1.

Referring to FIG. 2, the feedback clock generator 104 includes cascaded (looped) flip-flops FF1 to FF4, a delay gate 112 for introducing a desired delay to the delayed internal clock, and a selector 113 for selecting one of the outputs from the flip-flops FF1 to FF4 and the output from the delay gate 112. Each of other feedback clock generators 105 and 106 has basically a similar configuration, although the number of frequency multiplication for the delayed internal clock CLK21 is different from the feedback clock generator 104 of FIG. 2 and the feedback clock generators 105 and 106 need not include the delay gate 112.

The cascaded flip-flops FF1–FF4 receive the delayed quadruple-frequency internal clock CLK21. Among the flip-flops FF1–FF4, each flip-flop receives a signal at the data input thereof from the non-inverting output of the preceding stage flip-flop, and the signal from the inverting output of the last stage flip-flop FF4 is delivered to the data input of the first stage flip-flop FF1. Thus, divided, delayed internal clocks are generated at the non-inverting outputs of respective flip-flops FF1–FF4. The divided, delayed internal clocks have a frequency equal to the reference frequency of the reference clock CLK10. Among the four output clocks CLK50–CLK53, an output from each flip-flop has a phase shift shifted from the phase of the preceding-stage flip-flop by ¼ period of the reference clock CLK21. In this text, the output clock CLK50, CLK51, CLK52 or CLK53 having a delay of n/4 period of the reference clock CLK10 (where n is zero to three) with respect to the reference clock CLK10 is called herein n/4-phase clock. In particular, the output clock CLK50 having an equal phase with respect to the reference clock CLK10 is called herein zero-phase clock.

The delay gate 112 introduces a fixed delay time to the delayed internal clock CLK21, the fixed delay time corresponding to either 0, ¼, 2/4 or ¾ of the period of the reference clock CLK10. The delay gate 112 has a simple configuration due to the limited number of fixed delay times, which is far less compared to the number of fine delay steps in the delay circuit 102.

Figure 3:
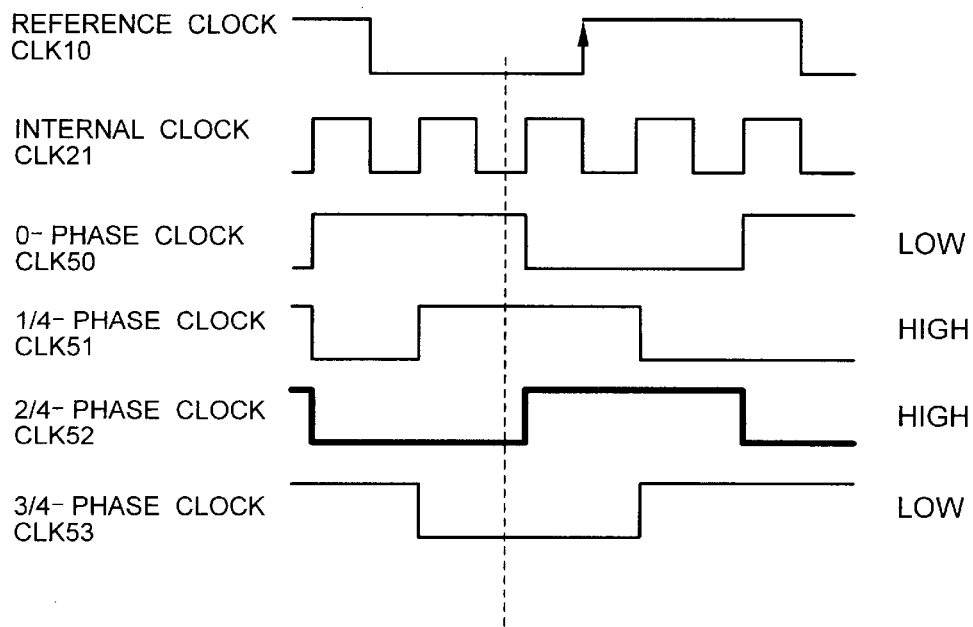
FIG. 3 is timing chart of clocks generated by the PLL circuit of FIG. 1 during selection of the feedback clock.

FIG. 3 shows the timing relationship between the reference clock CLK10, delayed internal clock CLK21 and the n/4-phase clocks generated in the feedback clock generator 104 of FIG. 2 during selection of the feedback clock. The feedback clock generator 104 generates n/4-phase clocks CLK50–CLK53 and outputs the n/4-phase clocks one by one by switching immediately after the start of the PLL circuit 100. The phase comparator 107 consecutively compares the phases of the n/4-phase clocks CLK50–CLK53 against the reference clock CLK10 by detecting high or low level of each n/4-phase clock at the rising edge of the reference clock CLK10. The selector 113 selects one of the four n/4-phase clocks CLK50–CLK53, which assumes a high level at the rising edge of the reference clock CLK10 and precedes another of the n/4-phase clocks assuming a low level at the rising edge. In the example of FIG. 3, based on the result of the phase comparison, the 2/4-phase clock CLK52 shown by a gothic line is selected as the feedback clock CLK15 to be supplied to the phase comparator 103.

Thus, the feedback clock CLK15 has a period equal to the period of the reference clock CLK10 and has a rising edge leading from and nearest to the rising edge of the reference clock CLK10. This feedback clock CLK15 defines a suitable locking point and prevents the pseudo locking.

Figure 4A:
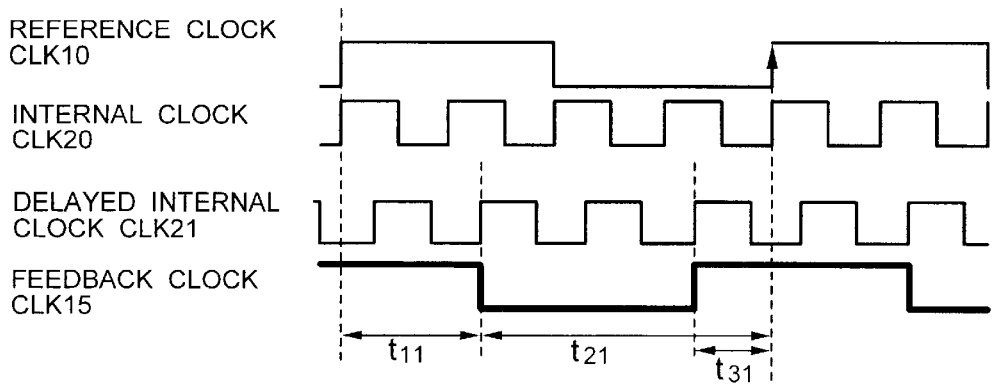
FIGS. 4A and 4B are timing charts of clocks generated by the PLL circuit of FIG. 1, during phase comparison and after the locking, respectively.
Figure 4B:
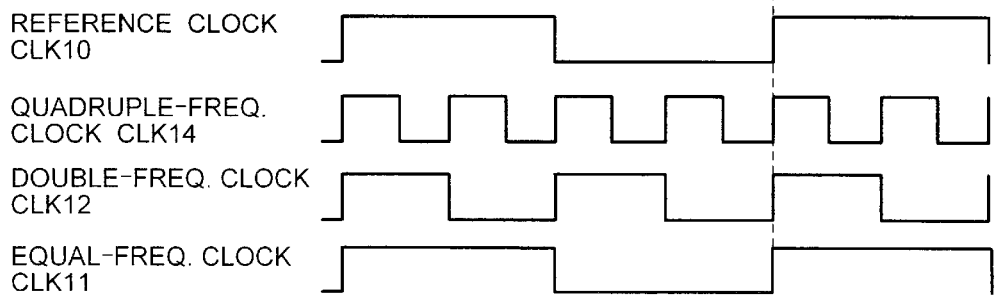
Figure 13A:
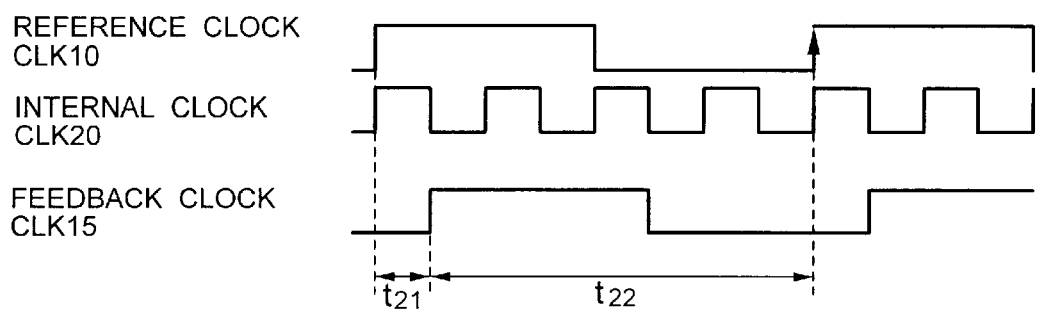
FIGS. 13A and 13B are timing charts of clocks in the frequency multiplying system of FIG. 12 before and after the locking, respectively.
Figure 13B:
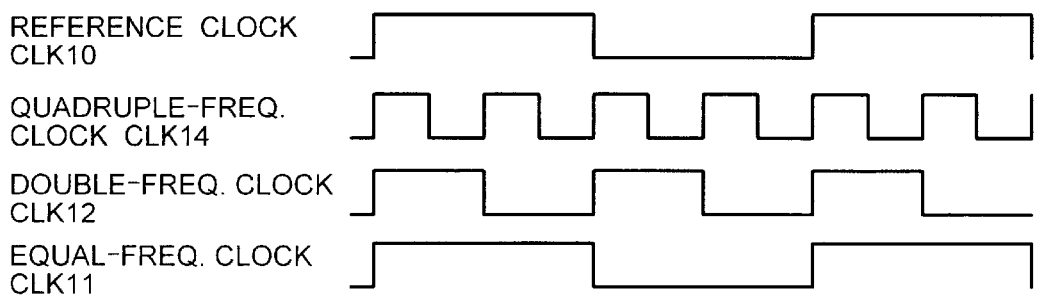
Figure 14A:
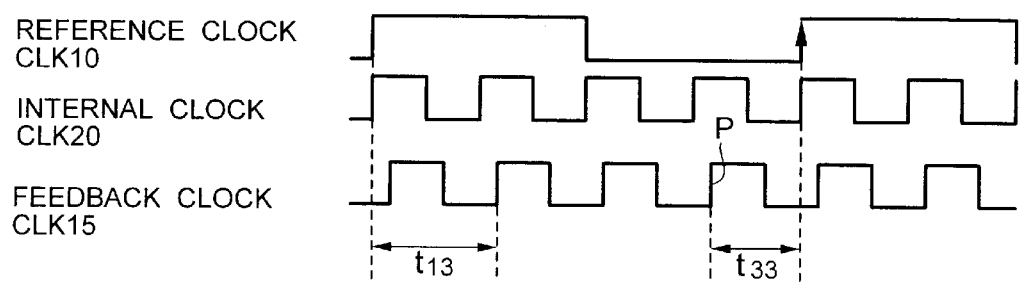
FIGS. 14A and 14B are timing charts showing, similarly to FIGS. 13A and 13B, respectively, clocks in the frequency multiplying system of FIG. 12 when the quadruple-frequency clock is used as the feedback clock.
Figure 14B:
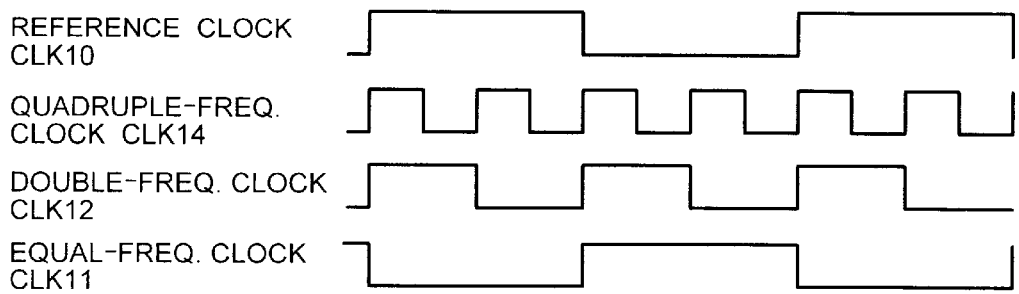
Figure 15A:
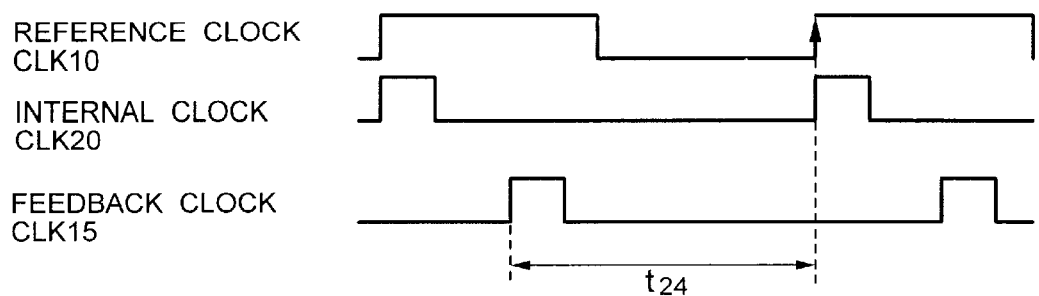
FIGS. 15A and 15B are timing charts showing similarly to FIGS. 13A and 13B, respectively, clocks in the frequency multiplying system of FIG. 12 when one of clock pulses in the feedback clock is output in a single period of the reference clock.
Figure 15B:
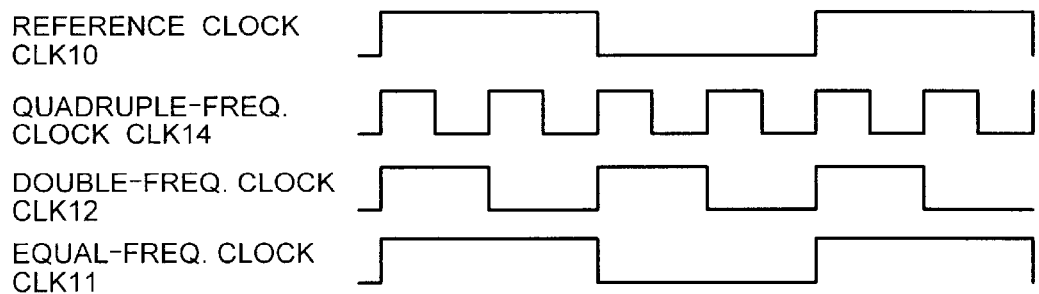

FIGS. 4A and 4B show the clocks in the PLL circuit 100 before and after the locking, similarly to FIGS. 13A and 13B, respectively. The PLL circuit 100 selects the feedback clock CLK15 as described above and effects the locking procedure. In FIG. 4A, the internal clock CLK20 is in synchrony with the reference clock CLK10, whereby the delayed internal clock CLK21 lags by t11 with respect to the reference clock CLK10. The 2/4-phase clock CLK52 having the reference frequency and a ⅔-period phase delay is selected as the feedback clock CLK15.

The PLL circuit 100 compares the phase of the feedback clock CLK15 against the phase of the reference clock CLK10, introduces a delay to the internal clock CLK20 so as to allow both the rising edges to coincide, and the locking is achieved after the introduced delay time equals t31. The delay time to be introduced resides within the delay control range which is equal to the period of the internal clock CLK20. Thus, the locking time needed for controlling the delay time is reduced compared to the locking time in the conventional PLL circuit.

After the locking is achieved, as shown in FIG. 4B, the delay gate 112 in the feedback clock generator 104 further introduces a phase delay corresponding to ⅔ period of the reference clock CLK10 to the delayed internal clock CLK21 output from the delay circuit 102, and delivers the resultant output clock CLK14. Each of the feedback generators 105 and 106 need not have or do not use the delay gate 112 before and after the locking. The function of the feedback generator 105 will be described with reference to FIG. 7. The feedback generator 106 delivers one of the outputs from the flip-flops FF1 to FF4 after the locking as well as before the locking. As understood from FIG. 4B, all the clocks depicted are in synchrony with the reference clock CLK10.

As described heretofore, the delay control range in the present embodiment is reduced down to $1/2^n$ period of the reference clock CLK10 in the case of a frequency multiplication of $2^n$ being employed in the frequency multiplier 101, and thus is reduced down to $1/2^n$ compared to the delay control range in the conventional PLL circuit. This reduces the locking time of the PLL circuit 100 accordingly.

After the locking, the quadruple-frequency clock CLK14 is used as the feedback clock CLK15, whereby the phase comparator 103 compares the quadruple-frequency clock CLK14 against the reference clock CLK10. The delay circuit 102 introduces a small delay time to the feedback clock CLK15 so that the rising edges of both the clocks CLK10 and CLK15 coincide with each other to achieve an accurate synchrony.

It may be considered that the phase difference between the reference clock CLK10 and the feedback clock CLK15 suddenly exceeds the one period of the quadruple-frequency clock CLK14 due to an external disturbance. In such a case, the PLL circuit 100 may be involved with a pseudo locking, wherein multiple-frequency clocks each having a period longer than the period of the quadruple-frequency clock CLK14 is involved with a phase shift. In the present embodiment, since the delay control range corresponds to one period of the quadruple-frequency clock CLK14, the correct locking point cannot be resumed from the false locking point after the pseudo locking. Thus, it cannot be assured that all the output clocks are in synchrony with the reference clock.

In the above circumstances, the frequency divider 109, phase comparator 107, delay circuit 108 and selection signal generator 110 in the present embodiment are used for monitoring occurrence of the pseudo locking after the locking is achieved. The frequency divider 109 receives the feedback clock CLK15 to output a verification clock CLK22 to the phase comparator 107. The phase comparator 107 receives the reference clock CLK10 and the verification clock CLK22 and compares the same against each other for synchrony verification. The delay circuit 108 introduces step delays to the feedback clock CLK15. The selection signal generator 110 monitors the results of the comparison by the phase comparators 103 and 107 against each other, to deliver a selection signal to the feedback clock generators 104, 105 and 106.

The frequency divider 109 divides, after the locking, the frequency of the feedback clock 15, i.e., quadruple-frequency clock CLK14 to generate a series of divided-frequency clocks CLK60–CLK63. The divided-frequency clocks CLK60–CLK63 have a period equal to the period of the reference clock and consecutive phase shifts which shift by ¼ period from the reference clock CLK10 and preceding divided-frequency clocks. The divided-frequency clocks are consecutively fed to the phase comparator 107, which also receives the reference clock CLK10 and consecutively compares the same against the divided-frequency clocks CLK60–CLK63.

One of the divided-frequency clocks CLK60–CLK63 is selected as the output from the frequency divider 109, the selected clock having a comparison result corresponding to the comparison result by the phase comparator 103 and thus judged to be in synchrony with the reference clock CLK10. The delay circuit 108 introduces a step delay such as ¼, ⅔ or ¾ to the feedback clock CLK15, the step delay corresponding to the phase delay of the clock selected as the output from the frequency divider 109. The selection signal generator 110 compares the comparison result by the phase comparator 103 and the comparison result by the phase comparator 107, and monitors whether or not both the comparison results coincide with each other. If the comparison results do not coincide with each other, the selection signal generator 110 delivers a signal to change the number of delay steps of the delay circuits 112 in the feedback clock generators 104, 105 and 106.

Figure 5A:
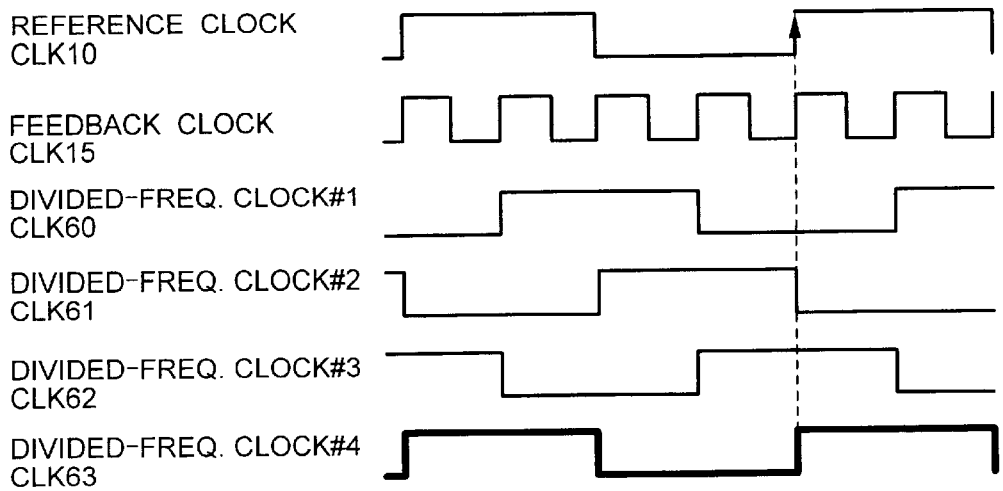
FIGS. 5A, 5B and 5C are timing chart of clocks during selection of feedback divided clock, in a synchronized state, and out of synchronized state, respectively.
Figure 5B:
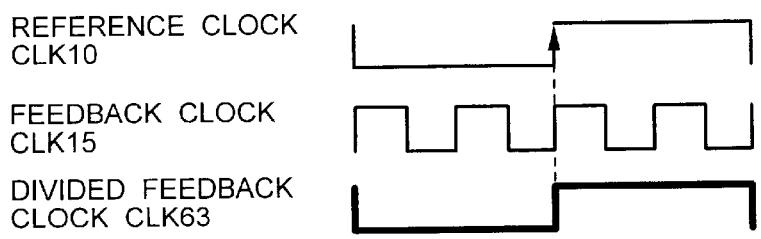
Figure 5C:
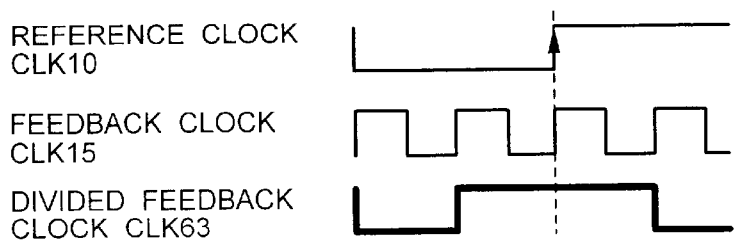

Referring to FIGS. 5A, 5B and 5C, there are shown timing charts of the clocks during selection of the divided-frequency clock, in the state of synchrony, and out of the state of synchrony, respectively. As shown in FIG. 5A, the divided-frequency clock CLK63 is selected as the verification clock 22 which has a rising edge coinciding with the rising edges of the reference clock CLK10 and the feedback clock CLK15.

The frequency divider 109, after selection of the verification clock 22, delivers the divided-frequency clock CLK63 to the phase comparator 107 for phase comparison against the reference clock CLK10. Upon synchronization of each multiple-frequency clock CLK11, CLK12 or CLK14 with the reference clock CLK10, both the clocks CLK15 and CLK63 to be compared against the reference clock CLK10 in the comparators 103 and 107, respectively, have respective rising edges coinciding with the rising edge of the reference clock CLK10, as shown in FIG. 5B.

FIG. 5C shows a case wherein both the comparison results are different from each other. In this case, the feedback clock CLK15 has a rising edge coinciding with the rising edge of the reference clock CLK10, whereas the divided-frequency clock CLK63, i.e., verification clock CLK22 has a rising edge leading the rising edge of the reference clock CLK10 by ¼ period. The selection signal generator 110 changes the number of delay steps of the delay circuits 112 in the feedback clock generators 104, 105 and 106 to add a delay of ¼ period so that both the comparison results coincide with each other. By this procedure, a phase shift of one period or more of the feedback clock CLK15 due to an external disturbance can be removed in the PLL circuit 100.

Figure 6:
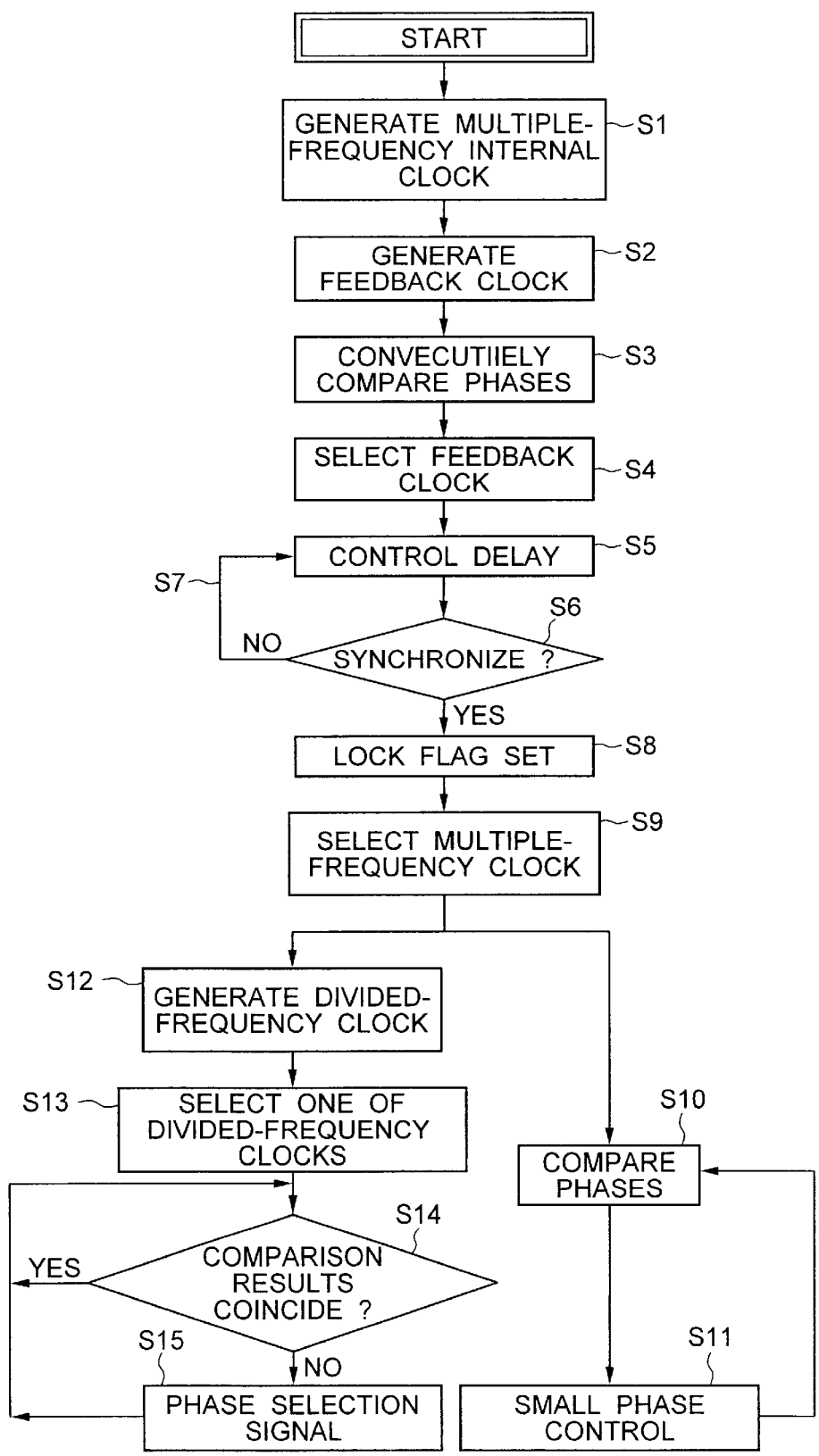
FIG. 6 is a flowchart showing the procedure by the PLL circuit of FIG. 1.

Referring to FIG. 6 showing the procedure of the frequency multiplying system, or PLL circuit 100, according to the present embodiment, an internal clock CLK20 is generated based on the reference clock CLK10 in the frequency multiplier 101 (step S1). The feedback clock generator 104 generates output clocks in number corresponding to the number of frequency multiplication in the frequency multiplier 101, wherein output clocks have a period equal to the period of the reference clock CLK21 and consecutive phase shifts by equal amount (step S2). The output clocks thus generated are consecutively delivered to the phase comparator 103.

The phase comparator 103 compares the rising edge of the reference clock CLK10 against the rising edges of the feedback clocks CLK15 provided in number corresponding to the number of frequency multiplication (step S3). The selector 112 selects one of the feedback clocks CLK15 (step S4), by using the technique as described with reference to FIG. 3. The phase comparator 103 compares the phase of the reference clock CLK10 against the phase of the selected feedback clock CLK15, controls the delay circuit 102 based on the result of comparison to introduce a delay to the internal clock CLK20 (step S5).

The phase of the internal clock having the introduced delay is compared against the phase of the reference clock CLK10, and if the internal clock having the introduced delay is not in synchrony with the phase of the reference clock CLK10 (step S6), the process returns to step S5 for iterating steps S5 and S6 until the phase difference between the delayed internal clock CLK21 and the reference clock CLK10 becomes below a threshold. If the phase difference becomes below the threshold, a lock flag is set to finish the locking procedure (step S8). The selector 112 in each of the feedback clock generators 104, 105 and 106 selects one of the multiple-frequency clocks having different phase shifts (step S9).

After the locking, the quadruple-frequency clock CLK14 is used as the feedback clock CLK15, which is iteratively compared against the reference clock CLK10 (step S10) to control the delay time introduced by the delay circuit 102 for a small phase control (S11). In addition, occurrence of a phase shift due to an external disturbance is monitored in parallel to the control of the phase.

After the lock flag is set, the frequency divider 109 generates divided-frequency clocks in number corresponding to the number of frequency multiplication (step S12), the divided-frequency clocks having a period equal to the period of the reference clock CLK10 and consecutive phase shifts from the reference clock CLK10 and preceding divided-frequency clocks. These divided-frequency clocks are fed to the phase comparator 107, and compared therein for phase verification against the reference clock CLK10.

The result of the phase comparison by the phase comparator 103 and the result of the phase comparison by the phase comparator 107 at the same timing are monitored in the selection signal generator 110, and one of the divided-frequency clocks providing a comparison result similar to the comparison result in the phase comparator 103 is selected (step S13). The selected divided-frequency clock is then delivered as the verification clock CLK22 to the phase comparator 107, and the comparison results by the phase comparators 103 and 107 are compared against each other (step S14). If the comparison results are matched, then the step S14 is iterated. On the other hand, if the comparison results are not matched, the delay step of the delay gate 112 in each of the feedback clock generators 104, 105 and 106 is changed and the process returns to step S14. This procedure assures a safe synchronization of all the multiple-frequency clocks with the reference clock CLK10.

As described above, during the locking operation, one of a plurality of clocks having a period equal to the period of the reference clock CLK10 and consecutive phase shifts by equal amount is selected as the feedback clock CLK15, which is compared against the reference clock CLK10 for synchronization. A single period of the multiple-frequency clock is sufficient for the delay control range effected by the delay circuit 102 during the locking operation, and thus is reduced down to $1/2^n$ compared to the conventional PLL circuit, which has a delay control range equal to the period of the reference clock CLK10. The shorter delay control range reduces the locking time accordingly.

After the locking, the quadruple-frequency clock CLK14 is used as the feedback clock CLK15 for achieving an accurate phase matching. In addition, the selection signal generator 110 detects a phase shift longer than the period of the quadruple-frequency clock CLK14 caused by an external disturbance, and assures that the PLL circuit 100 resume the original synchronization wherein all the multiple-frequency clocks are synchronized with the reference clock CLK10.

Figure 7:
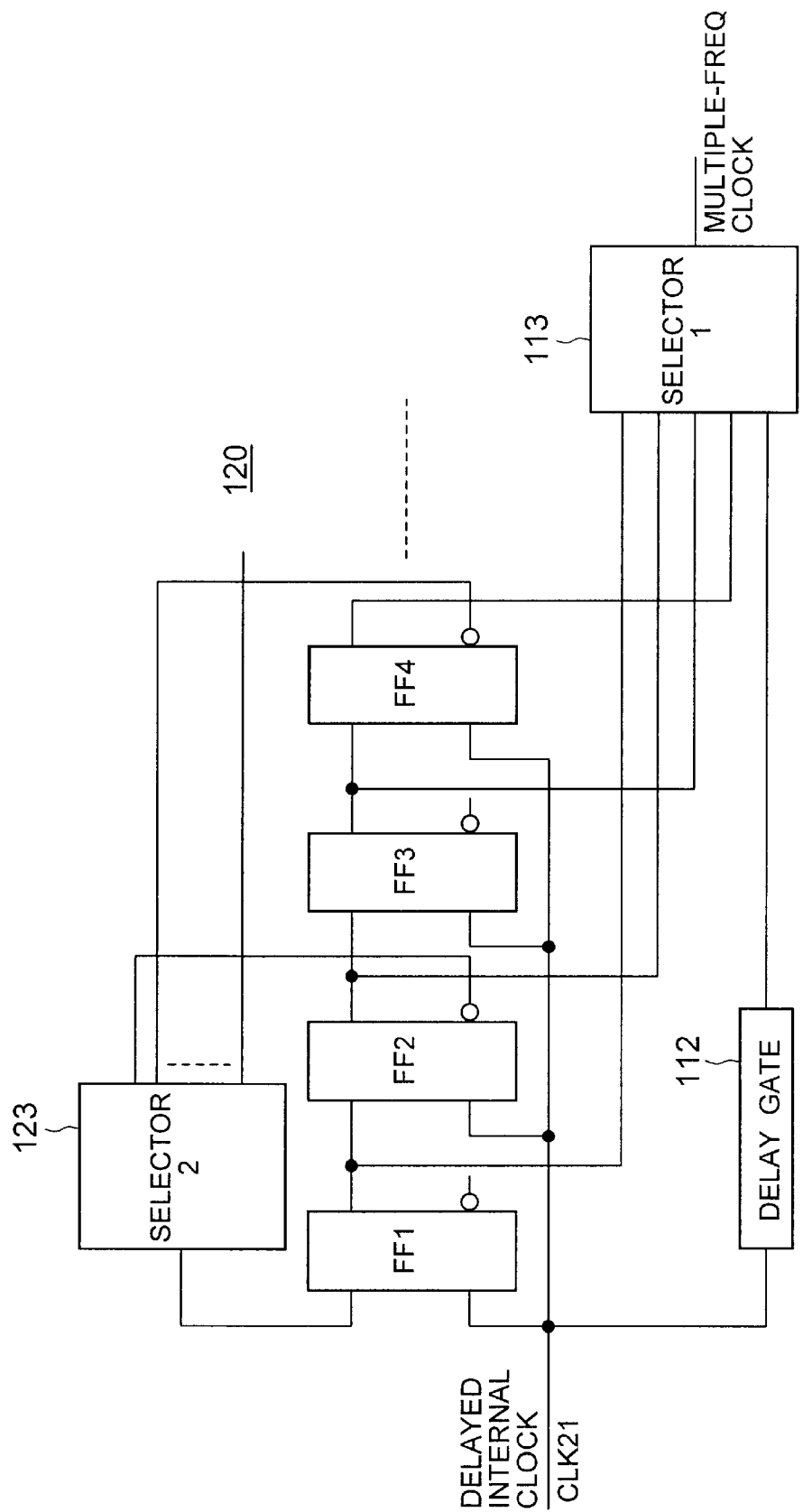
FIG. 7 is a block diagram of a feedback clock generator in a frequency multiplying system according to a second embodiment of the present invention.

Referring to FIG. 7, a feedback clock generator 120 in a frequency multiplying system according to a second embodiment is similar to the feedback clock generator 104 of FIG. 2 except for a selector 123 provided in the second embodiment. The feedback clock generator 120 of FIG. 7 may be used as the feedback clock generator 105 or 105 shown in FIG. 1. In the feedback generator of FIG. 7, the inverting outputs of the flip-flops FF2 and FF4 are connected to the selector 123, which selects one of the inverting outputs from the flip-flops FF2 and FF4 to deliver the selected output to the data input of the first stage flip-flop FF1.

The selector 123 in the feedback clock generator 120 of FIG. 7 can deliver a double-frequency clock as well as an equal-frequency clock after the clocking of the PLL circuit 100. More specifically, if the selector 123 selects the inverting output from the flip-flop FF2, then the feedback clock generator 120 generates a ½-divided-frequency clock, or the double-frequency clock in terms of the reference frequency. On the other hand, if the selector 123 selects the inverting output form the flip-flop FF4, then the feedback clock generator 120 generates a ¼-divided-frequency clock, or the equal-frequency clock in terms of the reference frequency. Use of a larger number of flip-flops with a corresponding number of terminals in the selectors 113 and 123 can increase the number of frequency division and allow a larger variable number for frequency division.

Figure 8:
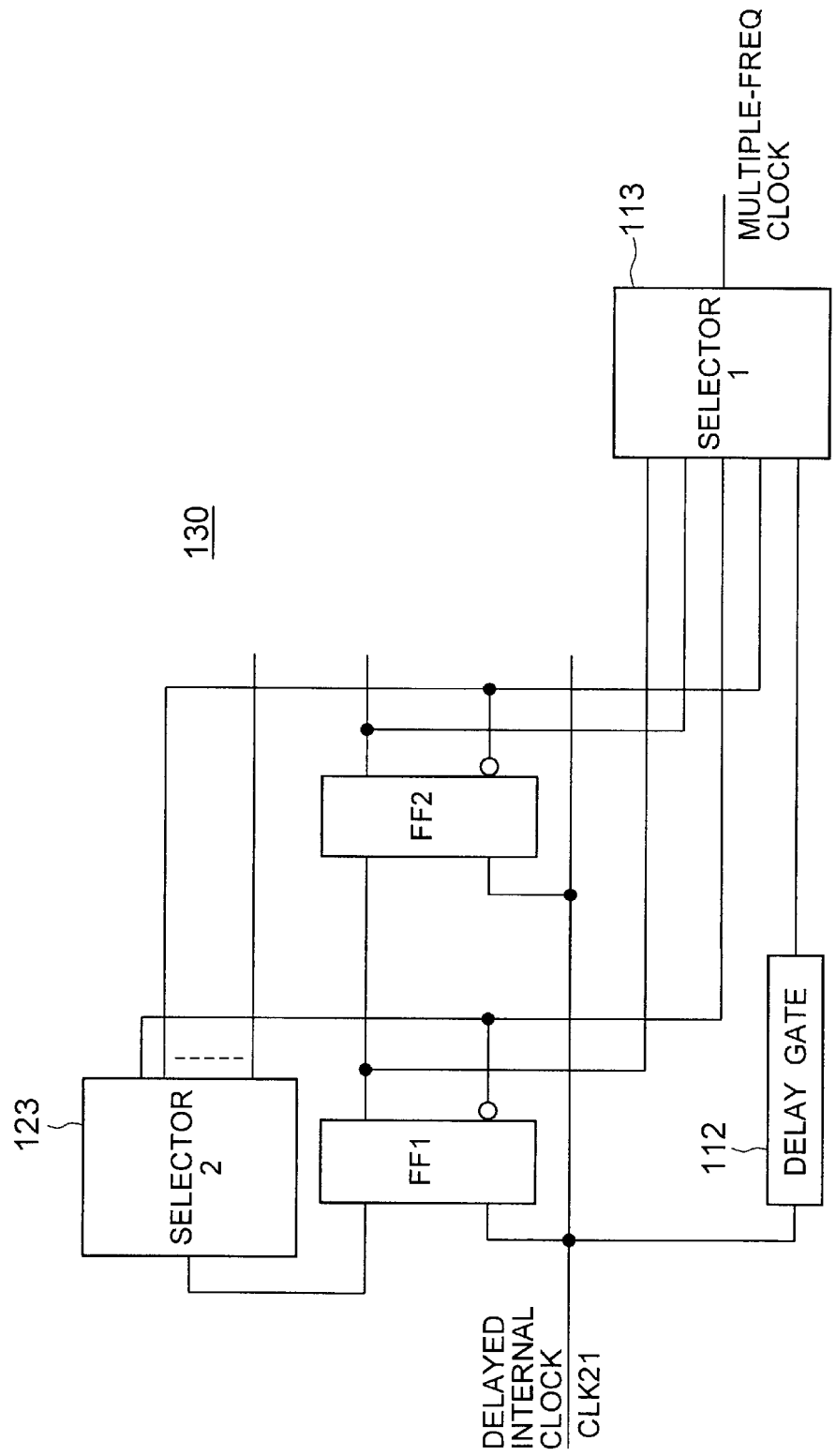
FIG. 8 is a block diagram of a feedback clock generator in a frequency multiplying system according to a third embodiment of the present invention.

Referring to FIG. 8, a feedback clock generator 130 in a frequency multiplying system according to a third embodiment of the present invention is similar to the feedback clock generator shown in FIG. 7 except for the number of flip-flops and the connections of the selector 123. More specifically, in the feedback clock generator 130 of FIG. 8, the inverting outputs of the flip-flops FF1 and FF2 are connected to the selectors 113 and 123, respectively. This configuration allows reduction of the number of flip-flops to achieve a simple structure of the feedback clock generator.

Figure 9:
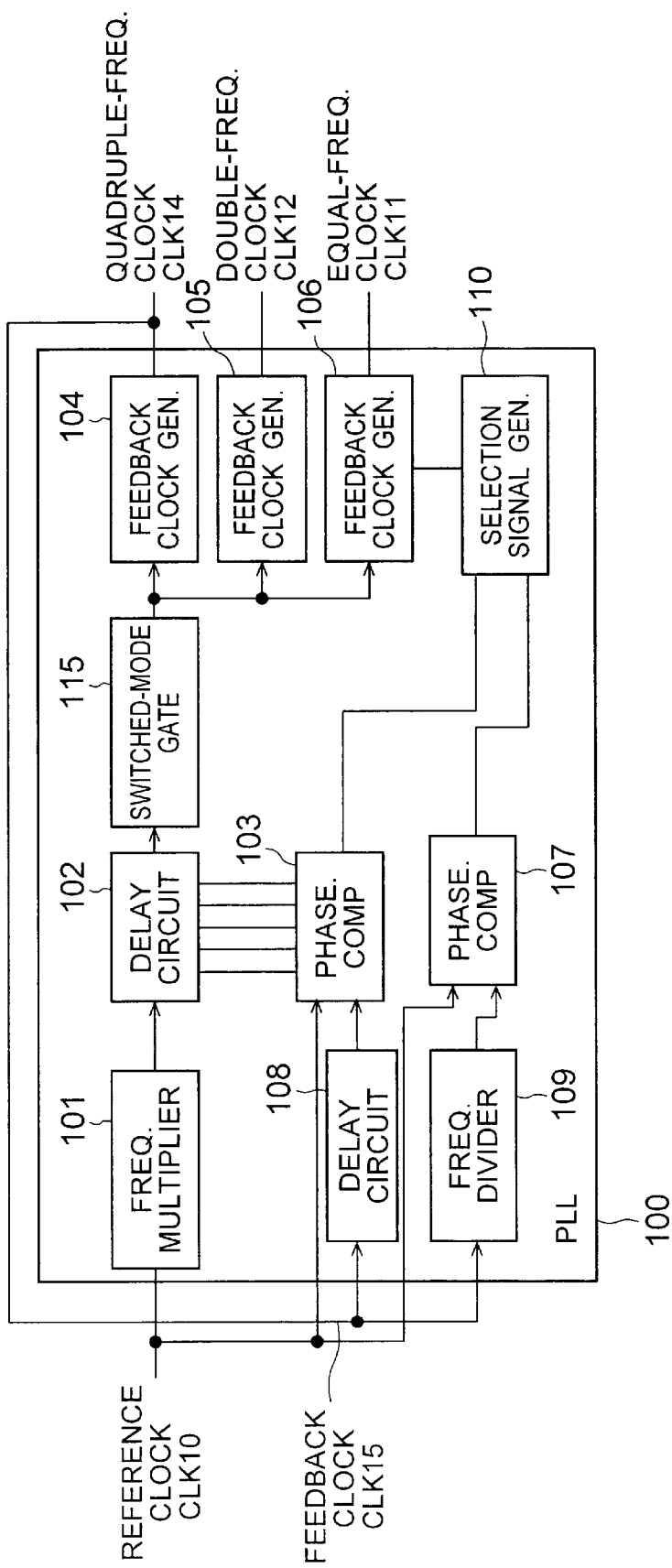
FIG. 9 is a block diagram of a feedback clock generator in a frequency multiplying system according to a fourth embodiment of the present invention.

Referring to FIG. 9, a frequency multiplying system 100 according to a fourth embodiment of the present invention is similar to the frequency multiplying system of FIG. 1 except that a switched-mode gate 115 is connected between the delay circuit 102 and the feedback clock generators 104, 105 and 106 in the present embodiment. The switched-mode gate 115 acts as either an inverter gate for generating an inverted, delayed internal clock or a transfer gate for transferring the delayed internal clock CLK21. The clock generated by the feedback clock generator 104 based on the inverted, delayed internal clock lags by ⅛ period with respect to the clock generated by the feedback clock generator 104 based on the delayed internal clock CLK21.

Figure 10:
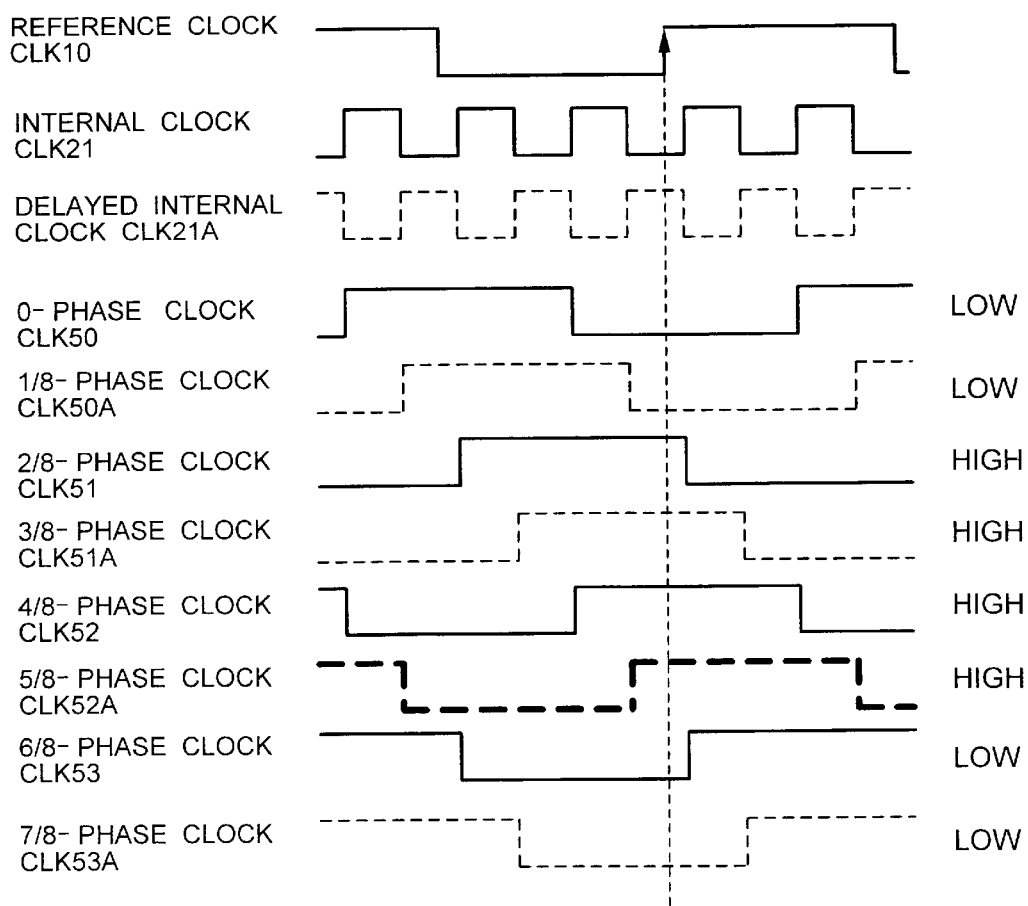
FIG. 10 is a timing chart of clocks during selection of the feedback clock in the frequency multiplying system according to the fourth embodiment.

Referring to FIG. 10 showing the clocks in the frequency multiplying system 100 of FIG. 9 during selection of the feedback clock, the switched-mode gate 115 either outputs delayed internal clock CLK21 received from the delay circuit 102 or the inverted, delayed internal clock CLK21A. The feedback clock generator 104 delivers one of eight clocks including zero-phase cock CLK50 generated based on the delayed internal clock CLK21, ⅛-phase clock CLK50A lagging by ⅛ period from the zero-phase clock CLK50 and generated based on the inverted, delayed internal clock CLK21A, ⅖-phase clock CLK51 lagging by ⅛ period from the ⅛-phase clock CLK50A and generated from the delayed internal clock CLK21, . . . , and ⅞-phase clock 53A lagging by ⅛ period from the ⅝-phase clock CLK53 and generated based on the inverted, delayed internal clock CLK21A. In FIG. 10, the clocks generated based on the delayed internal clock CLK21 are depicted by solid lines, whereas the clocks generated based on the inverted, delayed internal clock CLK21A are depicted by dotted lines.

The selector 113 in the feedback clock generator 104 consecutively outputs the zero-phase clock CLK50 to ⅞-phase clock CLK53a generated from the delayed internal clock CLK21 and the inverted, delayed internal clockA, and one of these clocks, i.e., ⅝-phase clock CLK52A depicted by a gothic solid line, is selected as the feedback clock CLK15 by the technique as described with reference to the first embodiment. It is to be noted that the ⅝-phase clock CLK52A assumes a high level at the timing of the rising edge of the reference clock CLK10, with the succeeding ⅝-phase clock CLK53 assuming a low level, and thus is selected as the feedback clock CLK15. Subsequent procedure for generating the multiple-frequency clocks is similar to that in the first embodiment.

In the PLL circuit 100 of the fourth embodiment, the switched-mode gate 115 generating the inverted, delayed internal clock CLK21A reduces the delay control range down to ⅛ of the period of the reference clock CLK10, thereby reducing the locking time of the PLL circuit 100.

Figure 11:
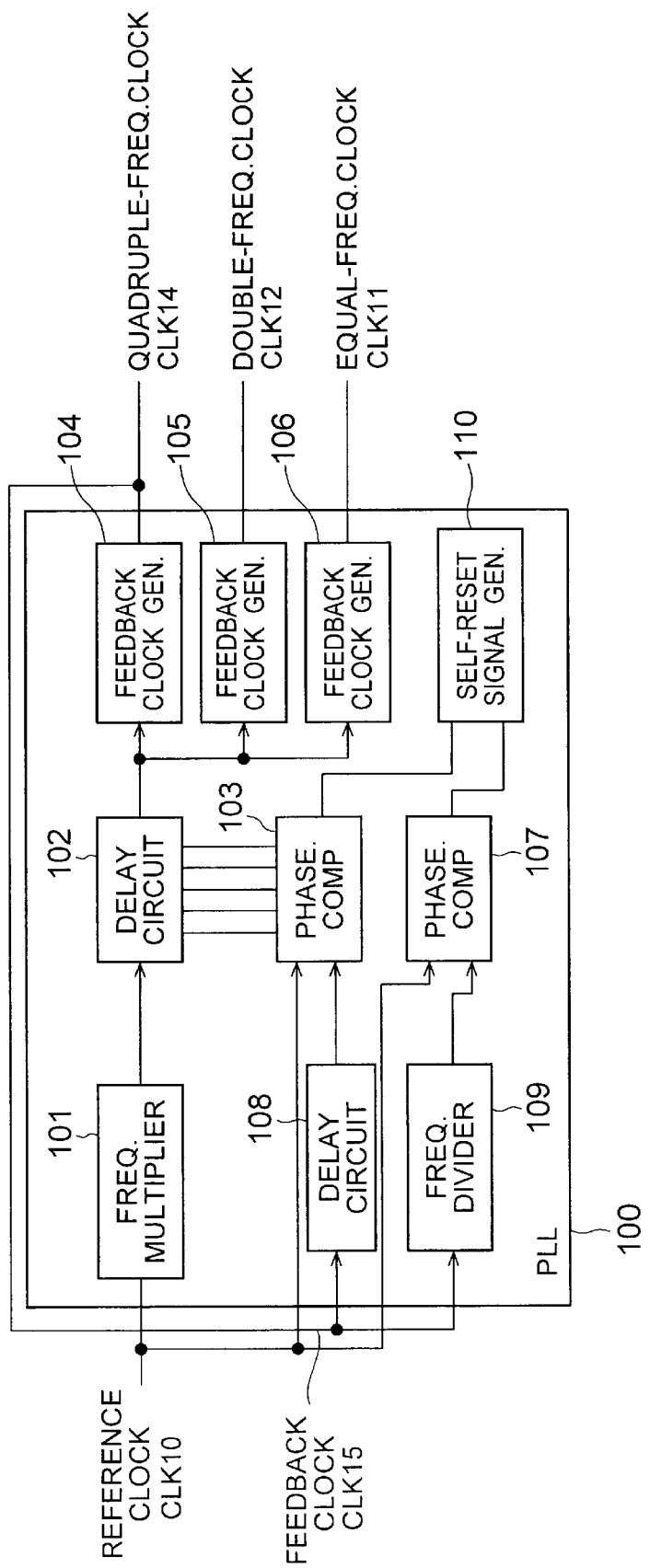
FIG. 11 is a block diagram of a frequency multiplying system according to a fifth embodiment of the present invention.
Figure 12:
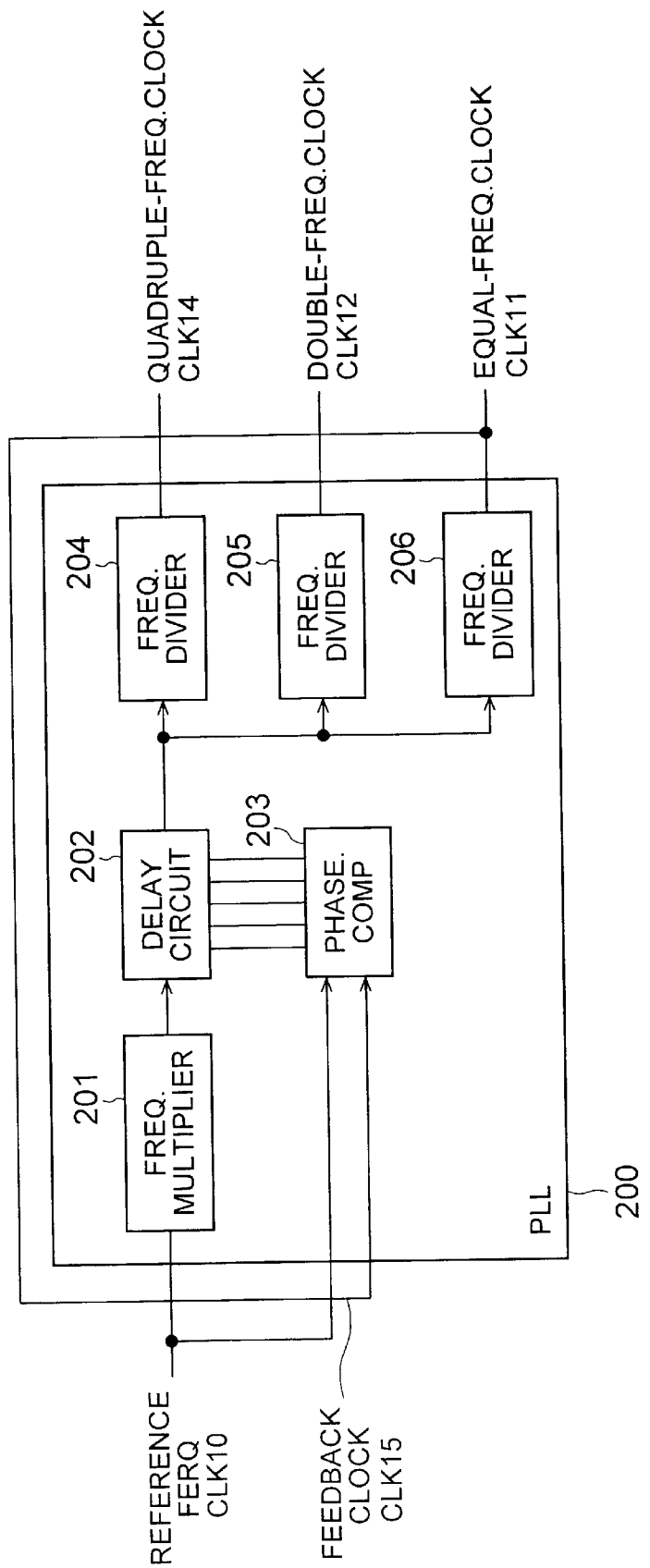
FIG. 12 is a conventional frequency multiplying system.

Referring to FIG. 11, a frequency multiplying system 100 according to a fifth embodiment of the present invention is similar to the first embodiment except that a self-reset signal generator 110 replaces the selection signal generator 110 and generates a self-reset signal which replaces the function of each of the delay circuits 112 in the feedback clock generators 104, 105 and 106. More specifically, back to FIG. 6, if the comparison results do not coincide with each other in step S14 for a specified time length, the self-reset signal generator 110 delivers a self-reset signal while assuming the occurrence of a failure. In this case, the procedure returns to step S1 to start the processing and thus prevent the multiple-frequency clocks CLK11, CLK12 and CLK14 from being at a continuous deviation from the synchrony with the reference clock CLK10.

Since the above embodiments are described only for examples, the present invention is not limited to the above embodiments and various modifications or alterations can be easily made therefrom by those skilled in the art without departing from the scope of the present invention. For example, the phase of the output clocks of the feedback clock may be compared against the phase of the reference clock by using a falling edge of the reference clock instead of the rising edge.

What is claimed is:

1. A frequency multiplying system comprising:
a frequency multiplier for multiplying a reference frequency of a reference clock by a specified number to generate an internal clock;
a delay circuit for introducing a first variable delay to said internal clock to output a delayed internal clock;
at least one clock generator for generating first clocks based on said delayed internal clock, said first clocks having a multiple of said reference frequency and consecutive phase shifts by an equal amount from a phase of said reference clock, said at least one clock generator selecting one of said first clocks having a phase leading from and nearest to the phase of said reference clock, said one of said first clocks selected by one of said at least one clock generator being fed back as a feedback clock; and
a first phase comparator for comparing a phase of said feedback clock against the phase of said reference clock, said first phase comparator controlling said first variable delay based on a result of comparison by said first phase comparator to achieve a locking.

2. The frequency multiplying system according to claim 1, wherein said at least one clock generator include a plurality of clock generators, and said one of said clock generators includes a delay gate for introducing a second variable delay to said delayed internal clock after said locking, said second variable delay corresponding to a delay of said selected one of said first clocks with respect to said reference clock.

3. The frequency multiplying system according to claim 2, wherein said feedback clock has a frequency equal to a frequency of said internal clock.

4. The frequency multiplying system according to claim 3, further comprising an additional-delay circuit for introducing consecutive second variable delays to said feedback clock, wherein outputs from said additional-delay circuit are consecutively input to said first phase comparator instead of said feedback clock after said locking.

5. The frequency multiplying system according to claim 4, further comprising:
a frequency divider for dividing a frequency of said feedback clock to generate verification clocks in a specified number;
a second phase comparator for comparing phases of said verification clocks against the phase of said reference clock; and
a phase selection section for selecting one of said verification clocks based on results of comparison by said first and second phase comparators.

6. The frequency multiplying system according to claim 4, further comprising:
a frequency divider for dividing a frequency of said feedback clock to generate verification clocks in a specified number;
a second phase comparator for comparing phases of said verification clocks against the phase of said reference clock; and
a reset signal generator for generating a reset signal based on results of comparison by said first and second phase comparators after said locking.

7. The frequency multiplying system according to claim 2 wherein each said clock generator includes cascaded flip-flops with a feedback loop to generate said first clocks.

8. The frequency multiplying system according to claim 7, wherein one of said clock generators includes another selector for selecting a frequency of said first clocks.

9. The frequency multiplying system according to claim 2, further comprising a switched-mode gate interposed between said delay circuit and said clock generator, said switched-mode gate being switched between a function to invert said delayed internal clock or a function to transfer said delayed internal clock as it is.

* * * * *